(12) United States Patent
Aoyama et al.

(10) Patent No.: US 7,956,697 B2
(45) Date of Patent: Jun. 7, 2011

(54) ATOMIC OSCILLATOR

(75) Inventors: Taku Aoyama, Setagaya (JP); Hiroshi Nomura, Chigasaki (JP); Naoki Ishihara, Machida (JP)

(73) Assignee: Epson Toyocom Corporation (JP)

( * ) Notice: Subject to any disclaimer, the term of this patent is extended or adjusted under 35 U.S.C. 154(b) by 59 days.

(21) Appl. No.: 12/349,040

(22) Filed: Jan. 6, 2009

(65) Prior Publication Data

US 2009/0174489 A1 Jul. 9, 2009

(30) Foreign Application Priority Data

Jan. 7, 2008 (JP) ................................ 2008-000369

(51) Int. Cl.
*H03L 7/26* (2006.01)
*H01S 1/06* (2006.01)

(52) U.S. Cl. ......................................... 331/94.1; 331/3

(58) Field of Classification Search ............. 331/3, 94.1; 356/437; 372/70–74
See application file for complete search history.

(56) References Cited

U.S. PATENT DOCUMENTS

| | | | |
|---|---|---|---|
| 5,339,155 A * | 8/1994 | Partridge et al. .............. | 356/419 |
| 6,806,784 B2 | 10/2004 | Hollberg et al. | |
| 7,359,059 B2 * | 4/2008 | Lust et al. ..................... | 356/459 |
| 7,405,827 B2 * | 7/2008 | Keranen ........................ | 356/432 |
| 7,619,485 B2 * | 11/2009 | DeNatale et al. ............. | 331/94.1 |
| 2008/0198027 A1 * | 8/2008 | Bugge ........................... | 340/632 |

FOREIGN PATENT DOCUMENTS

| JP | 10-284772 | 10/1998 |
|---|---|---|
| JP | 2008-000364 | 1/2008 |

* cited by examiner

*Primary Examiner* — Robert Pascal
*Assistant Examiner* — Levi Gannon
(74) *Attorney, Agent, or Firm* — Harness, Dickey & Pierce, P.L.C.

(57) ABSTRACT

An atomic oscillator that controls an oscillation frequency by using an optical absorption property derived from a quantum interference effect occurring when two kinds of resonance light are made incident as coherent light having different wavelengths from each other, includes an optical system that includes: a gas cell sealing metal atoms in a gas state therein; a coherent light source for supplying the resonance light to the metal atoms being in the gas cell; and a light detector for detecting light transmitted through the gas cell. In the atomic oscillator, a first refraction unit is formed at a light incident side, on which coherent light is made incident, of the gas cell.

8 Claims, 5 Drawing Sheets

ATOMIC OSCILLATOR

BACKGROUND

1. Technical Field

The present invention relates to an atomic oscillator, especially to a mounting technique of a gas cell included to an atomic oscillator.

2. Related Art

Atomic oscillators using alkali metals such as rubidium and cesium operate while maintaining a gas cell, in which atoms are air-tightly sealed, at a high temperature because the atoms need to be kept in a gas state when the oscillators use energy transition of the atoms. An operating principle of the atomic oscillators is broadly classified into a double resonance method utilizing light and micro waves as disclosed in JP-A-10-284772 as a first example and a method utilizing quantum interference effect produced by two kinds of laser light (hereinafter, referred to as coherent population trapping: CPT) as disclosed in U.S. Pat. No. 6,806,784 as a second example.

FIG. 6A shows a structure of a related art atomic oscillator adopting the CPT. An atomic oscillator 50 includes an optical system in which a semiconductor laser 52, a gas cell 54, and a light detector 56 are formed in a unified manner as disclosed in the second example. In the gas cell 54, alkali metal atoms (not shown) such as a rubidium atom and a cesium atom that are quantum absorbers are sealed. The semiconductor laser 52 produces two kinds of laser light (coupling light and probe light) having different wavelengths from each other and outputs the laser light to the gas cell 54. The atomic oscillator 50 detects how much laser light made incident to the gas cell 54 is absorbed by metal atom gas with its light detector 56 so as to detect atomic resonance, and allows a reference signal of a quartz crystal oscillator and the like to synchronize with the atomic resonance at a control system such as the frequency control circuit 58, obtaining an output. The light detector 56 is positioned at an opposite side of the side, to which the light is made incident, of the gas cell 54.

FIG. 6B shows energy levels of the quantum absorbers. The energy levels of the quantum absorbers include two ground levels (a ground level 1 and a ground level 2) and a three-level system (A type level system, for example) having an excitation level. When a difference between two frequencies ($\omega 1$ and $\omega 2$) of the resonance light that is simultaneously radiated precisely matches an energy difference between the ground level 1 and the ground level 2, the three-level system can be expressed by the coherent state between the ground level 1 and the ground level 2. That is, the excitation to the excitation level is stopped.

Namely, as shown in an optical absorption spectrum of FIG. 6C, the quantum absorbers in the gas cell 54 absorb the laser light radiated from the semiconductor laser and an optical absorption property (transmission) varies depending on frequency difference between the two kinds of light. In a case where frequencies of the coupling light and the probe light have specific values, neither two kinds of the light are absorbed but transmit (electromagnetically induced transparency (EIT) phenomenon). The CPT uses this EIT phenomenon so as to detect and use a state, in which the light absorption is stopped in the gas cell when one of or both of the two wavelengths are varied, as an EIT signal (refer to FIG. 6C) having a shape like $\delta$ function. In the second example, collimated semiconductor laser (dual wavelength having an energy difference of an hyperfine structure of the alkali metal atoms in a ground state) is made incident from a light incident window on a gas cell in which alkali metal atoms are sealed.

In the optical system of the related art atomic oscillator 50 shown in FIG. 6A, a beam radius of the laser light is substantially smaller than a cross-section area of the gas cell 54. Therefore, the laser light interacts with part of the atoms in the gas cell 54 without changing its laser radius, travels straight through a light emitting window, and reaches a part of the light detector 56 that is opposed to the light emitting window.

In such structure, the laser light performs the light-atom interaction only with the part of the metal atoms on an optical path in the gas cell 54, whereby almost all of the metal atoms uselessly exist. Further, if the laser radius is small as this, the metal atoms passing across the laser light in an orthogonal direction have short interacting time t with the laser light. A width (energy width) of the EIT signal, shown in FIG. 6C, formed by the light-atom interaction is inversely proportional to the interacting time t due to the uncertainty principle. Therefore, if the laser radius is small, the width (half bandwidth of detected intensity) of the EIT signal is increased, deteriorating a quality as a signal.

The width of the EIT signal formed by the light-atom interaction is inversely proportional to an electric field amplitude (intensity) of the laser light. This phenomenon is derived from that Rabi frequency is increased in proportion to an electric field. That is, if the laser light has a strong intensity, the width of the EIT signal is increased, deteriorating its quality as a signal. Further, in a case where a light receiving area of the light detector 56 is large, only a region corresponding to the laser radium is used and therefore a sufficient S/N ratio, which is essentially detected by the detector, can not be obtained.

Further, as disclosed in the first example, such structure may be acceptable that a lens is interposed between a laser light source and the gas cell on an optical path of the laser light so as to spread the laser light by the lens and evenly irradiate the metal atoms with the light, but this structure increases the number of components. Therefore, this structure is not suitable for miniaturizing of the atomic oscillator.

SUMMARY

An advantage of the present invention is to provide an atomic oscillator that can be miniaturized and provide a preferable EIT signal.

The above advantage can be attained by the following aspects of the invention.

An atomic oscillator, according to an aspect of the invention, that controls an oscillation frequency by using an optical absorption property derived from a quantum interference effect occurring when two kinds of resonance light are made incident as coherent light having different wavelengths from each other, includes an optical system that includes: a gas cell sealing metal atoms in a gas state therein; a coherent light source for supplying the resonance light to the metal atoms being in the gas cell; and a light detector for detecting light transmitted through the gas cell. In the atomic oscillator, a first refraction unit is formed at a light incident side, on which coherent light is made incident, of the gas cell.

A material of the gas cell has a different refractive index from air, so that a traveling direction of the incident light varies depending on an incident angle of the incident light on the gas cell. Further, if the refractive index of the material of the gas cell is uneven in a cross-section area direction of the light, the incident light is refracted. The light traveling with a certain cross-section area is refracted in different directions on each element of the refraction unit in the cross-section area direction after passing through the refraction unit. As a result, the light is spatially dispersed and travels.

Thus the first refraction unit is formed on the light incident side of the gas cell, so that the coherent light is dispersed in the gas cell, and almost all of the metal atoms existing in the gas cell are irradiated with the coherent light so as to be able to generate light-atom interaction. Therefore, an EIT signal having a large detected intensity can be obtained.

Further, the coherent light is dispersed by the first refraction unit, so that the intensity of light with which the metal atoms are irradiated is decreased. Therefore, the width described above can be decreased, improving the quality of the EIT signal. Even in a case where the light receiving area of the detector is larger than the original cross-section area of the coherent light, allowing the coherent light to pass through the first refraction unit disperses the coherent light so as to permit the whole light receiving part of the detector to receive the coherent light. Thus an inherent S/N ratio of the detector can be secured.

Further, due to the integration of the gas cell and the refraction unit, a device in which the gas cell is built is advantageously miniaturized. The integration does not increase the number of components so as to achieve a simplified manufacturing process, reduced manufacturing cost, increased yield of the device, and improved reliability of the device, compared to a case where the first refraction unit is externally built.

In the atomic oscillator of the aspect, the first refraction unit may be a concave lens.

Accordingly, the coherent light is dispersed and spread in the gas cell right after passing through the concave lens and thus the metal atoms in the gas cell are irradiated with the coherent light. Accordingly, the atomic oscillator that can be easily manufactured at a low cost and provide a large EIT signal is obtained.

In the atomic oscillator of the aspect, the first refraction unit may be a convex lens.

Accordingly, though the coherent light is once focused after passing through the convex lens, after that, the coherent light is spatially dispersed in the gas cell. Thus the metal atoms in the gas cell are irradiated with the coherent light. Accordingly, the atomic oscillator that can be manufactured at a low cost and provide a large EIT signal is obtained as the above case.

In the atomic oscillator of the aspect, the first refraction unit may be a refractive index distribution type lens.

In the refractive index distribution type lens, the refractive index is distributed in a concentric circle manner in a radius direction and becomes small from the center toward the edge of the lens. Changing the thickness of the refractive index distribution type lens enables the light flux to spatially disperse in both ways using the convex lens and using the concave lens. Even though the refractive index distribution type lens has a planar shape, one can be selected from the refraction unit functioning as the concave lens and the refraction unit functioning as the convex lens so as to be able to spatially disperse the light flux of the coherent light.

The oscillator having such structure exhibits the similar advantage as the above cases. Further, the oscillator has a flat plate structure having no convex part so as to be able to be further miniaturized, and proper selection of the refractive index of the refraction unit enables highly accurate control of an optical path without changing the outer shape of the gas cell.

A stuck structure of the oscillator with a planar optical element (a wave plate, for example) which is interposed between the coherent light source and the gas cell is simple so as to be able to miniaturize the oscillator with the planar optical element. Further, no gap is produced between the optical elements so as to provide a dust control effect, whereby prolonged reliability of the device can be ensured.

In the atomic oscillator of the aspect, a second refraction unit may be formed at a side, which faces the light detector, of the gas cell, and the second refraction unit may be a convex lens.

In a case where the light receiving area of the light detector is small, the light detector can not receive whole of the coherent light that is dispersed, whereby a large EIT signal can not be obtained. Therefore, with the above structure, the coherent light emitted after transmitted under the light-atom interaction is converged at the convex lens, so that the light detector can receive the coherent light at its small light receiving area, being able to obtain the EIT signal having a large detected intensity.

In the atomic oscillator of the aspect, the second refraction unit may be a refractive index distribution type lens.

Due to this structure, the oscillator has the similar advantage to that of the above structure. Further, the side, which faces the light detector, of the gas cell has a planar structure, so that the stuck structure of the planar optical element, interposed between the gas cell and the light detector, and the light detector can be achieved. Therefore, the oscillator with the planar optical element can be miniaturized in a similar way to the above. Further, no gap is produced between the optical elements so as to provide the dust control effect, being able to secure prolonged reliability of the device.

In the atomic oscillator of the aspect, the coherent light may be laser light.

Common light has random phases because various wavelengths are mixed. In contrast, the laser light has good monochromaticity and has uniform phases. Stability of wavelength and phase of such light is defined as coherence. Light with a high coherence, that is, light with stable wavelength and phase can generate the quantum interference effect. The leaser light is optimal in this respect.

In the atomic oscillator of the aspect, the metal atoms in a gas state may be one of rubidium and cesium.

Use of cesium atoms enables the achievement of a highly accurate atomic oscillator. Rubidium atoms are widely supplied and readily available. Either one of these metal atoms can be selected in view of required performance and a cost of the atomic oscillator.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention will be circumstantially described below with reference to the accompanying drawings. Note that elements, kinds, combinations, shapes, relative positions, and the like described in the embodiments do not limit the range of this invention, but are only examples unless the description gives a special statement.

First Embodiment

Figure 1A:
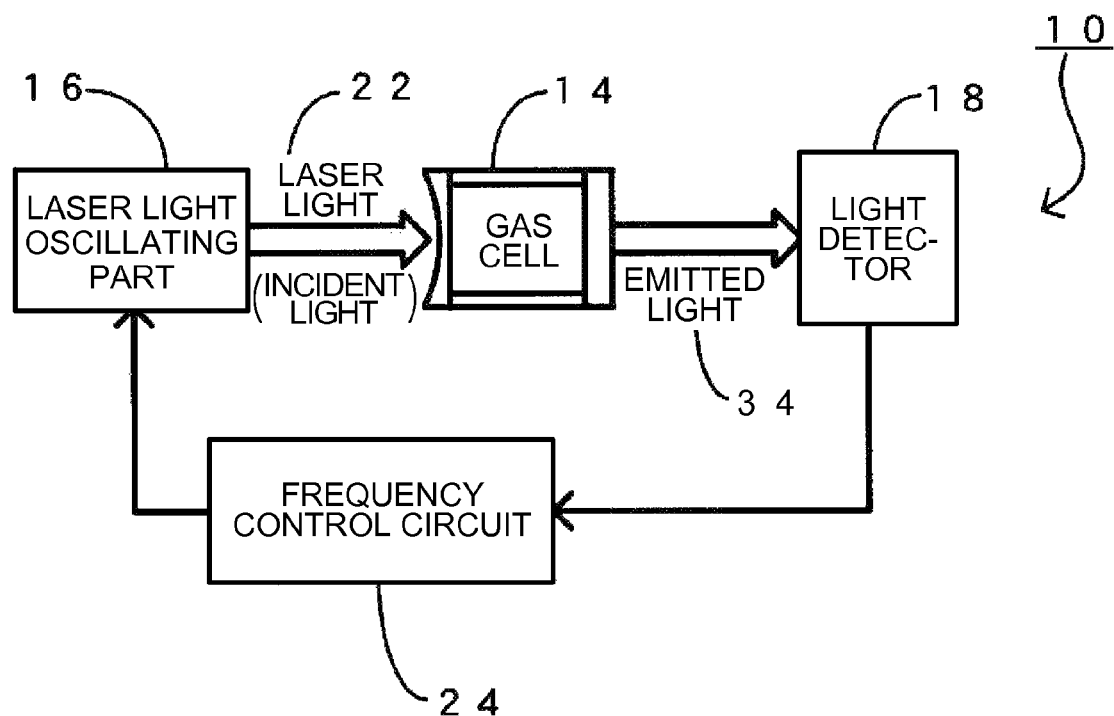
FIGS. 1A and 1B are schematic views showing an atomic oscillator of a first embodiment.

FIG. 1A is a configuration diagram showing an atomic oscillator according to a first embodiment of the invention. An atomic oscillator 10 according to the first embodiment controls an oscillation frequency by utilizing an optical absorption property derived from the quantum interference effect produced when two kinds of resonance light having different wavelengths from each other is made incident as coherent light. The atomic oscillator 10 is provided with an optical system which includes: a gas cell 14 in which metal atoms 12 in a gas state are sealed; a laser light oscillating part 16 that is a coherent light source supplying the resonance light to the metal atoms 12 in the gas cell 14; and light detector 18 detecting light that has passed through the gas cell. A light incident window 20 that is positioned at a light incident side, for the coherent light, of the gas cell is composed of a refraction unit 30 (a first refraction unit) that is a concave lens 30a. Here, a major point of this invention is on a structure of the optical system included to the atomic oscillator 10, so that detailed description on frequency control of the atomic oscillator 10 will be omitted.

Referring to FIG. 1A, the laser light oscillating part 16 (preferably, a semiconductor laser) that is a coherent light source oscillates laser light 22 having two kinds of oscillating wavelengths and including coupling light and probe light that are collimated, at a time in the same light axis direction. Note that the laser light 22 having the two kinds of wavelengths can be individually changed in each wavelength. Accordingly, the metal atoms 12 in one gas cell can be simultaneously irradiated with the laser light 22 having two kinds of different wavelengths and the wavelengths of the laser light 22 are controlled so as to allow the metal atoms 12 to perform light absorption accompanied with an electromagnetically induced transparency (EIT) signal.

The light detector 18 is disposed down the light axis direction of the laser light 22. The light detector 18 has a frequency property including a light detecting sensitivity in a variable wavelength range of the laser light 22. A control system such as a frequency control circuit 24 is electrically interposed between the light detector 18 and the laser light oscillating part 16. If the light detector 18 detects light, the frequency control circuit 24 detects atomic resonance according to the EIT signal and synchronizes a reference signal of a crystal oscillator, for example, with the atomic resonance so as to obtain an output. Further, a light incident surface of the light detector 18 is properly positioned so as to form a solid angle (the center is a focal position of the concave lens 30a, a convex lens 30b, and a refractive index distribution type lens 30c) larger than light flux that is spread in a circular cone shape.

The gas cell 14 is disposed on the optical axis, which runs through the laser light oscillating part 16 and the light detector 18 in a linear fashion, of the laser light. The gas cell 14 includes the light incident window 20, a light emitting window 26, and a body 28. The gas cell 14 is heated by a heater (not shown) so as to be at a proper temperature for generating the EIT phenomenon of the metal atoms 12 when the atomic oscillator 10 is operated. The light incident window 20 and the light emitting window 26 are made of a material such as glass through which the laser light 22 passes, and their outer shapes are formed so as to correspond to the outer shape of end faces of the body 28. The light incident window 20 and the light emitting window 26 are bonded to the end faces of the body 28 so as to form an internal space 29 that is hermetically sealed. The body 28 is a chassis having a rectangular form, a cylindrical form, and the like. The body 28 may be made of any material as long as the body 28 made of the material has predetermined rigidity and does not deform, resolve, corrode, and the like at an operating temperature of the atomic oscillator 10. However, the body 28 is preferably made of the same material as that of the light incident window 20 and the light emitting window 26. In the internal space 29, the metal atoms 12 such as cesium and rubidium that are quantum absorbers are sealed. The metal atoms 12 exist in the internal space 29 in a gas state at a certain degree of density in accordance with saturated vapor pressure, which is determined by the temperature and the degree of vacuum of the internal space 29, of the metal atoms 12.

The metal atoms 12 are sealed as follows: forming an introduction hole (not shown) for introducing the metal atoms 12 to the body 28; connecting a vacuum system (not shown) composed of a vacuum pump, a crucible, a pipe, and the like from the introduction hole; making the body 28 vacuum up to a certain degree of vacuum by the vacuum pump; heating the crucible so as to evaporate the metal atoms 12 that have been put in the crucible in a solid state in advance; transferring the metal atoms 12 to the internal space 29 by utilizing the temperature gradient between a part in which the crucible is present (high temperature) and the internal space 29; and closing the introduction hole. Alternatively, the metal atoms 12 are sealed by bonding the body 28, the light incident window 20, and the light emitting window 26 in the system in which the metal atoms 12 are exist in the gas state. To prevent the metal atoms 12 from separating out from a laser light path running through the light incident window 20 and the light emitting window 26 in the room temperature and the temperature of the gas cell in operating the atomic oscillator 10, the degree of vacuum, the temperature of the crucible and the internal space 29, and the like in sealing the metal atoms 12 need to be properly adjusted while considering the saturated vapor pressure of the metal atoms 12.

Figure 1B:
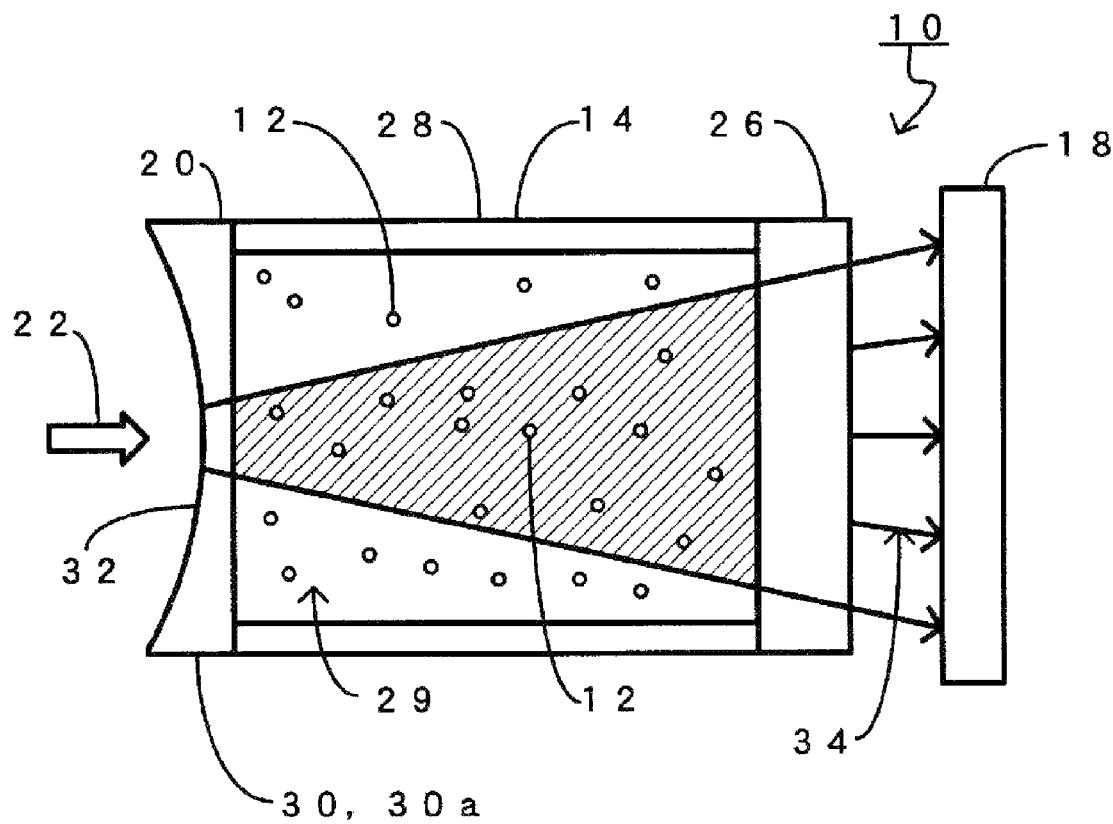

As shown in FIG. 1B, the light incident window 20 is the concave lens 30a (a first refraction unit) that refracts and disperses the laser light 22 and a concave part 32 formed at an external side of the gas cell 14. That is, the gas cell 14 and the concave part 32 that is formed on the light incident window 20 form an integral structure. Thus, the optical system in which the concave lens 30a is interposed between the laser light oscillating part 16 and the gas cell 14 is obtained.

The light incident window 20 having a concave lens shape can be formed such that a material (glass, for example) of the light incident window 20 is melted at a high temperature, the melted material is poured into a female die for forming an outer shape of the light incident window 20 including the concave part 32, the material is cooled down so as to be hardened, and the hardened material is taken out. Or, the light incident window 20 can be formed such that a material, which is in a flat plate shape, of the light incident window 20 is ground with the grinding machine or by using an abrasive so as to be provided with a concave shape. The material, which is to be the concave lens 30a, of the light incident window 20 is transparent in a variable range of the laser light 22, and has no wavelength dispersibility of a refractive index. The laser light 22 having two kinds of wavelengths are spatially dispersed by the concave lens 30a in the same manner despite of the wavelengths and thus the laser light 22 does not separate and disperse in spatially different directions (chromatic aberration) in each wavelength. The focal length of the concave lens 30a is determined by a curvature of the concave part 32 and the refractive index of the material of the light incident window 20. Though the light incident window 20 can be provided with a curvature also on its side facing the internal space 29 so as to obtain a lens effect, the side facing the internal space 29 is preferably flat for the hermetic property between the light incident window 20 and the body 28.

The operation of the atomic oscillator 10 having the above structure, according to the first embodiment, will now be described. The laser light oscillating part 16 is started up so as to oscillate the laser light 22 having two kinds of wavelengths and the laser light 22 is made incident from the light incident window 20. Then the wavelengths of the laser light 22 are properly controlled so as to allow the metal atoms 12 to perform the optical absorption with a quantum interference effect, and the optical absorption spectrum is measured through the light detector 18. At this time, the refractive index of the material (glass, for example), which is to be the concave lens 30a, of the light incident window 20 is different from that of outside air. Therefore, if the material is shaped in a lens manner, light traveling with a certain cross-section area is refracted in different directions in each element in the cross-section area direction of the light after passing through the light incident window 20. As shown in FIG. 1B, in a case of the concave lens 30a, the light flux of the laser light 22 spreads in a manner forming a circular cone (shaded region) in a traveling direction so as to be spatially dispersed. Then the laser light 22 that is spatially spread by the concave lens 30a in the gas cell 14 goes out from the light emitting window 26 so as to be emitted light 34, and the emitted light 34 reaches a light receiving face of the light detector 18.

At this time, all of the metal atoms 12 in a shaded region of the figure are irradiated with the laser light 22. Thus the laser light 22 passes through the light incident window 20, that is, the concave lens 30a so as to spread the light flux thereof. The metal atoms 12 are uniformly distributed in the internal space 29, so that more metal atoms 12 can be irradiated with the light flux of the laser light 22 compared to a case of parallel light.

Figure 6A:
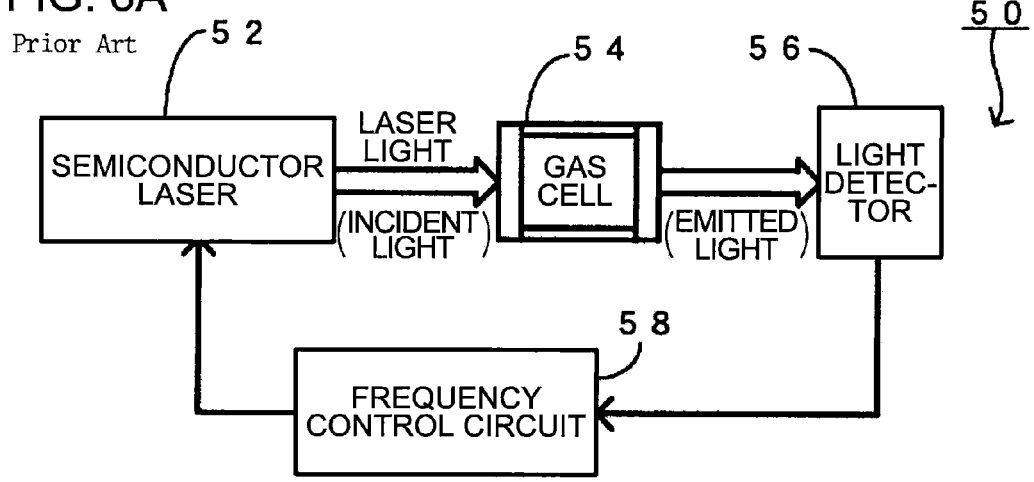
FIG. 6A is a schematic view showing a related art atomic oscillator.
Figure 6B:
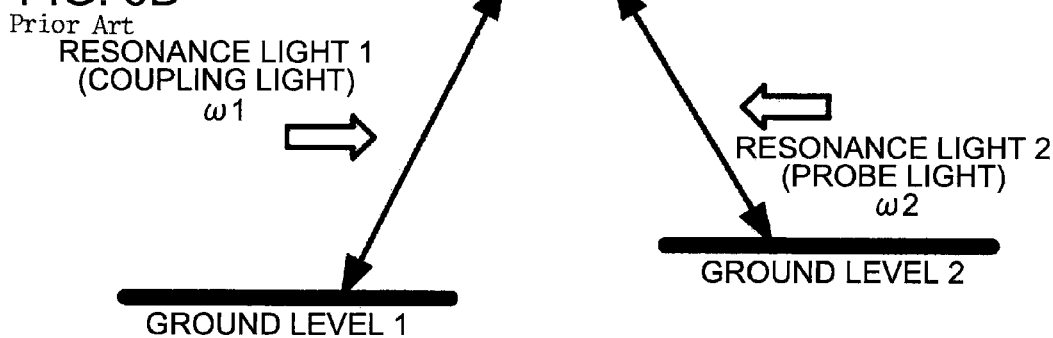
FIG. 6B is a diagram showing energy levels.
Figure 6C:
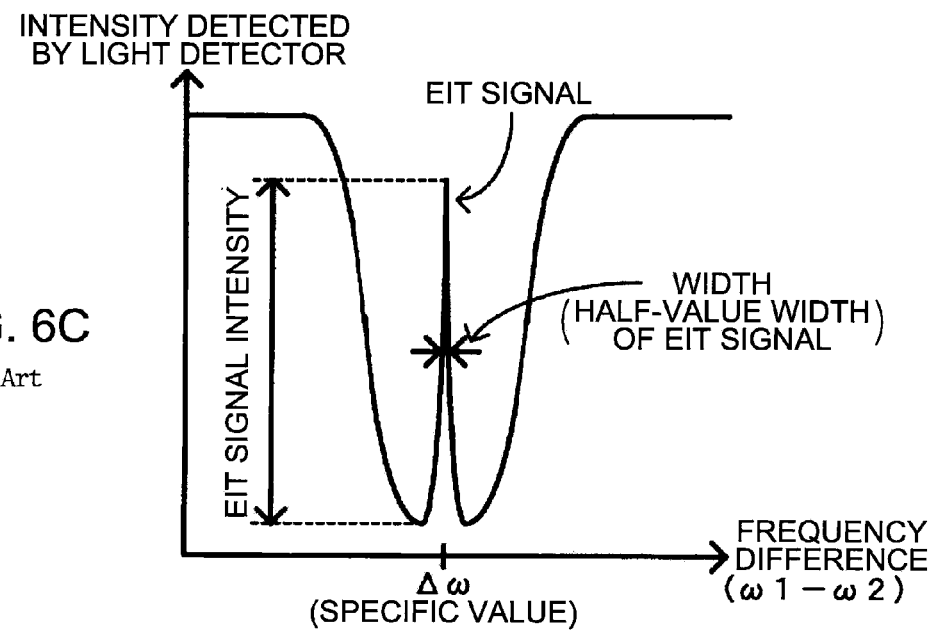
FIG. 6C is a diagram showing an optical absorption spectrum.

The light receiving face of the light detector 18 is properly disposed so as to form a solid angle larger than the light flux that is spread into a circular cone shape, whereby the whole of the laser light 22 that is dispersed reaches the light receiving face. Therefore, the intensity of the emitted light that is received by the light detector 18 is same between an oscillator including the concave lens 30a on the optical path of the laser light 22 and an oscillator including no concave lens 30a, but the number of the metal atoms 12 irradiated with the laser light 22 is larger in the case with the concave lens 30a. As a result, the intensity (refer to FIG. 6C) of the EIT signal is larger in the case with the concave lens 30a than the case without the concave lens 30a.

According to the first embodiment, the concave lens 30a that is the refraction unit 30 is formed as the light incident window 20 on the light incident side of the gas cell 14. Accordingly, the laser light 22 that is coherent light is dispersed in the gas cell 14 and almost all the metal atoms 12 in the gas cell 14 are irradiated with the laser light 22. Thus light-atom interaction between the laser light 12 and the almost all the metal atoms 12 occurs, being able to obtain the EIT signal having large detected intensity.

The laser light 22 is dispersed by the concave lens 30a, so that the intensity of light with which each of the metal atoms 12 is irradiated is reduced. Therefore, the width existing in the optical absorption spectrum of an EIT signal shown in FIG. 6C can be decreased, improving the quality of the EIT signal. Further, even in a case where the light receiving area of the light detector 18 is larger than the original cross-section area of the laser light, allowing the laser light to pass through the refraction unit enables the light detector 18 to evenly receive the laser light 22 that is the coherent light by its whole light receiving part, being able to maintain its inherent S/N ratio.

Further, the gas cell 14 and the concave lens 30a are integrated, so that a device in which the gas cell 14 is built is advantageously miniaturized. The integration does not increase the number of components so as to achieve a simplified manufacturing process, reduced manufacturing cost, increased yield of the device, and improved reliability of the device, more than a case where the concave lens 30a that is the refraction unit 30 is externally built.

Second Embodiment

Figure 2:
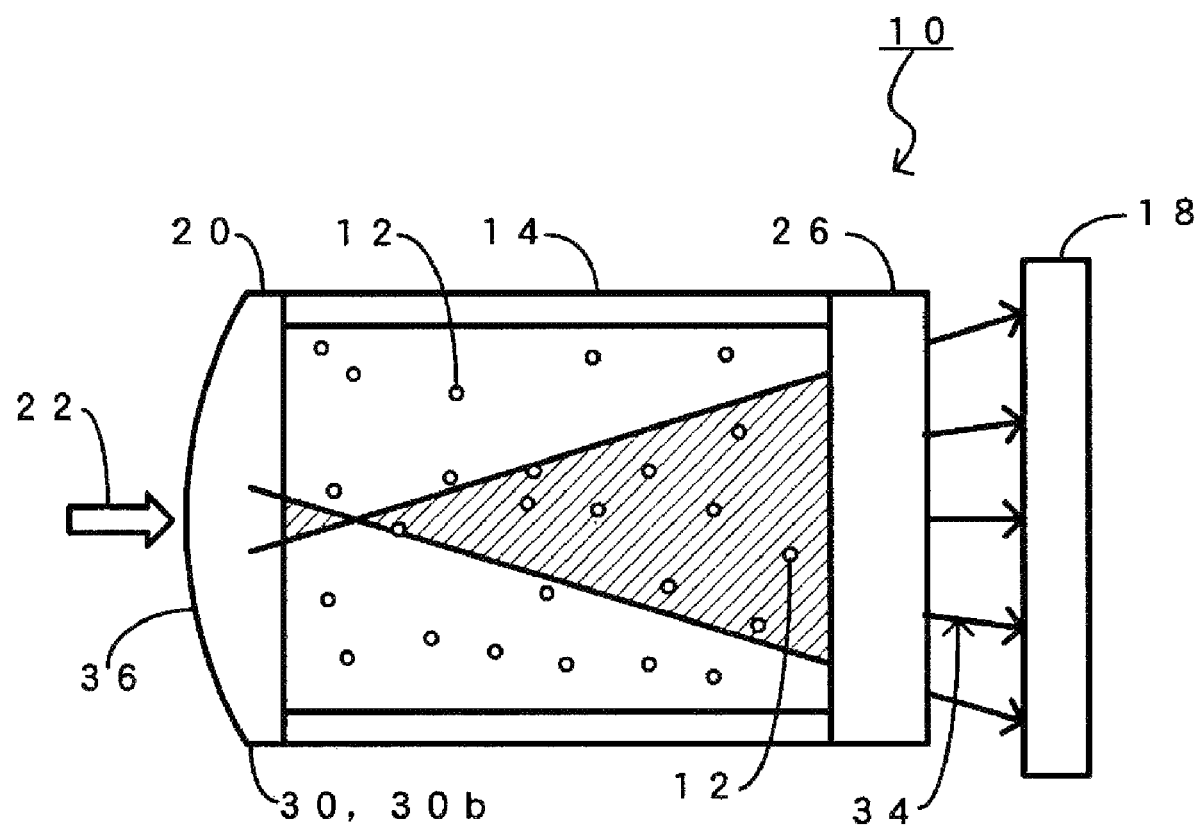
FIG. 2 is a schematic view showing an atomic oscillator of a second embodiment.

FIG. 2 is a schematic view showing an atomic oscillator according to a second embodiment. Though the essential structure is similar to that of the first embodiment, the light incident window 20 is formed in a convex lens manner in the second embodiment. As is the case with the first embodiment, the light incident window 20 also serves as a convex lens 30b (the first refraction unit). The forming method of the convex lens 30b is same as that of the concave lens 30a of the first embodiment. The curvature of a convex part 36 of the convex lens 30b needs to be set such that the focal length formed by the convex part 36 of the convex lens 30b, more precisely, an operating distance of the convex lens 30b from the end to a focal point (back focus length) in the optical axis direction is substantially shorter than the length of the body in the optical axis direction.

Accordingly, the laser light 22 that is the coherent light passes through the light incident window 20 formed in the convex lens manner and is focused once, but, after that, the laser light 22 is spatially dispersed to spread in the gas cell 14. Thus the metal atoms 12 that exist in a shaded area of FIG. 2 are irradiated with the laser light 22. Accordingly, the atomic oscillator that can be manufactured at a low cost and provide a large EIT signal is obtained as is the case with the first embodiment.

Third Embodiment

Figure 3A:
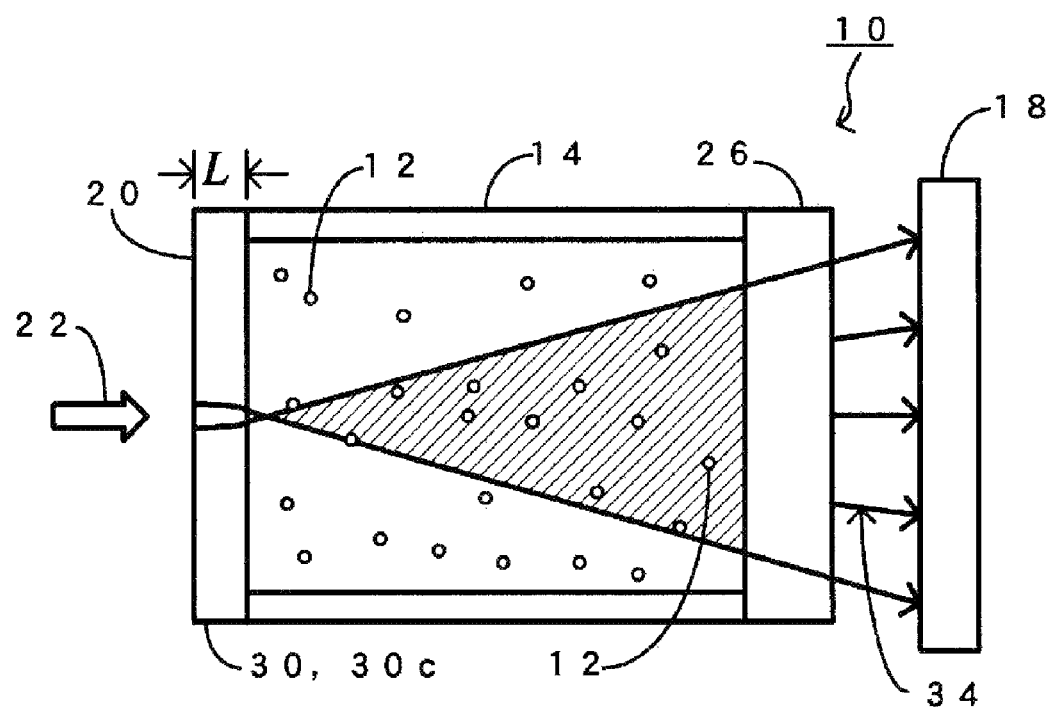
FIGS. 3A and 3B are schematic views showing an atomic oscillator of a third embodiment.
Figure 3B:
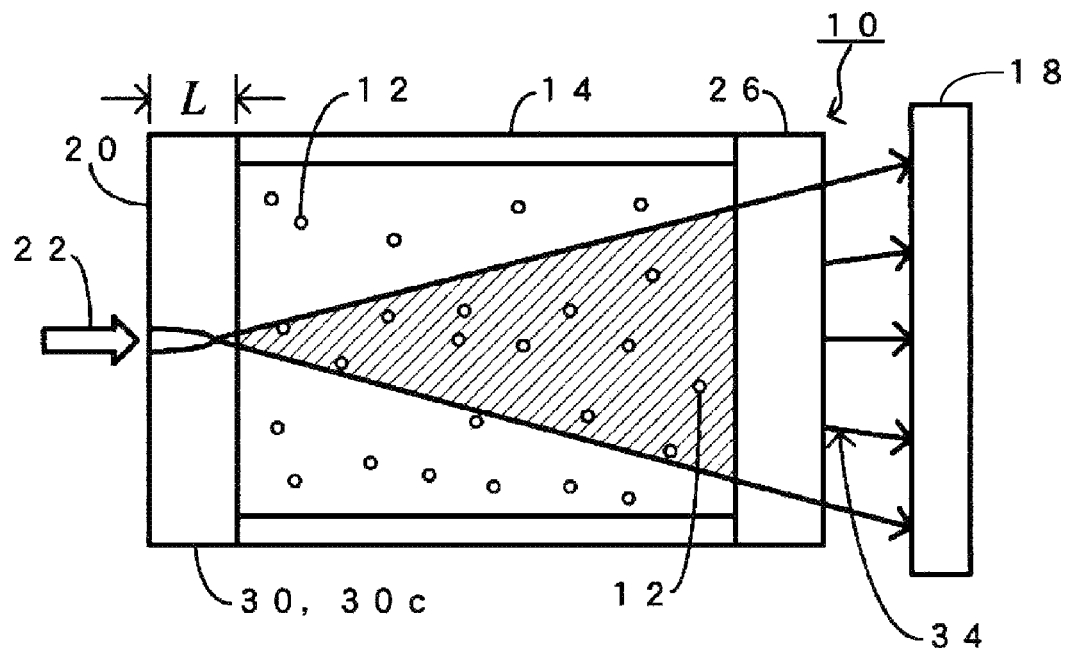

FIGS. 3A and 3B are schematic views showing an atomic oscillator according to a third embodiment. Though the essential structure of the oscillator 10 of the third embodiment is similar to that of the first embodiment, the refraction unit 30 (the first refraction unit) forming the light incident window 20 is a refractive index distribution type lens 30c. Though the refractive index distribution type lens 30c is made of planar glass material, the refractive index of the refractive index distribution type lens 30c varies as a function of a radius to be expressed as the following formula.

$$n_r = n_o\left[1 - \frac{A}{2}r^2\right] \quad \text{Formula 1}$$

Here, $n_r$ denotes a refractive index at a distance r from the optical axis, $n_o$ denotes a designing refractive index on the optical axis, and A denotes a positive constant number. In a case of a lens, light is refracted only on an interface between air and the lens, and travels straight in a lens medium. On the other hand, in a case of a refractive index distribution type lens, the light is refracted not only at the interface but also inside the refractive index distribution type lens. Therefore, a focal distance f of the refractive index distribution type lens depends on the thickness L and is expressed as the following formula.

$$f = \frac{1}{n_o \sqrt{A} \sin(L\sqrt{A})} \quad \text{Formula 2}$$

The focal distance f varies as a trigonometric function with respect to the thickness L. Therefore, in a case where the thickness L of the lens is sufficiently large, parallel light made incident on the refractive index distribution type lens repeats converging and diverging of the flux light thereof within the refractive index distribution type lens as drawing an envelope curve.

The operating distance (back focus length) $d_w$ is expressed as the following formula.

$$d_w = \frac{1}{n_o \sqrt{A}} \cot(L\sqrt{A}) \quad \text{Formula 3}$$

Though the refractive index distribution type lens focuses the light once, the operating distance $d_w$ can be not only a positive value but also a negative value. In a case of the positive value, the light is focused after going out of the refractive index distribution type lens 30c as the convex lens as shown in FIG. 3A and then dispersed in a manner spreading light flux thereof in a circular cone manner. In a case of the negative value, as shown in FIG. 3B, the light is focused within the refractive index distribution type lens 30c and then dispersed in a manner spreading in a circular cone state. Namely, the light flux is dispersed as is the case with a concave lens when it is viewed from outside. Thus, proper setting of the thickness L enables a selection of the light incident window 20 serving also as the refraction unit 30 of a concave lens type or the light incident window 20 of a convex lens type, being able to spatially disperse the light flux of the laser light 22.

$$L\sqrt{A} = \frac{\pi}{2} + n\pi \ (n\text{: integer number}) \quad \text{Formula 4}$$

Here, when Formula 4 is satisfied, the light emitted from the refractive index distribution type lens 30c is parallel light. The refractive index distribution type lens needs to be disposed on the body such that the center of the light flux of the laser light passes through a part at which the refractive index of the refractive index distribution type lens becomes $n_o$.

According to the third embodiment, the oscillator having the similar advantage as that of the first or second embodiment can be obtained. The oscillator has a flat plate structure having no convex part 36 that is described in the second embodiment so as to be able to be further miniaturized, and proper selecting of the refractive index of the refraction unit 30 enables highly accurate control of the optical path without changing the outer shape of the gas cell 14.

A planar optical element (not shown) is interposed between the laser light oscillating part 16 and the gas cell 14 on the optical axis in practice. The planar optical element and the refractive index distribution type lens 30c can be bonded to each other in a manner allowing plane surfaces thereof to face each other. According to the third embodiment, a stuck structure of the oscillator with the additive planar optical element is simple so as to be able to miniaturize the oscillator including the planar optical element. Further, no gap is produced between the optical elements so as to provide a dust control effect, whereby prolonged reliability of the device can be ensured.

Fourth Embodiment

Figure 4:
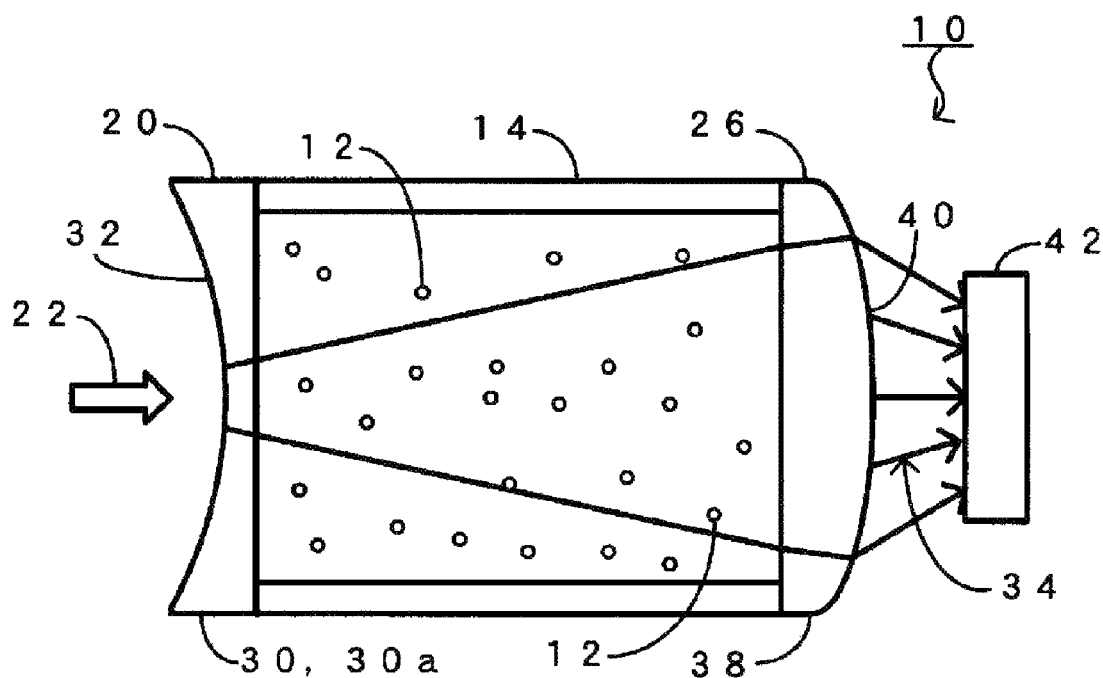
FIG. 4 is a schematic view showing an atomic oscillator of a fourth embodiment.

FIG. 4 is a schematic view showing an atomic oscillator according to a fourth embodiment. Though the essential structure of the atomic oscillator 10 according to the fourth embodiment is same as that of the first to third embodiments, the light emitting window 26, which is positioned to face the light detector, of the gas cell is a convex lens 38 (a second refraction unit). At a position which faces the light emitting window 26 of the gas cell 14, a light detector 42 having a small light receiving area is disposed. The forming method of a convex part 40 of the convex lens 38 is similar to that of the convex part 36 of the second embodiment. The focal distance of the convex part 40 is set to be shorter than that of the refraction unit 30 (the concave lens 30a in FIG. 4) forming the light incident window 20. The light flux of the laser light 22 that is spatially dispersed by the refraction unit 30 forming the light incident window 20 converges after passing through the convex part 40. The light detector 42 having a light receiving area of a similar size to a cross section of the light flux that is converged is disposed at a position where the light flux is converged to have a proper cross-section area, whereby the laser light 22 can be received on the small light receiving area.

According to the fourth embodiment, the laser light 22 that is the coherent light emitted after transmitted under light-atom interaction is converged by the convex part 40. Therefore, the light detector 42 receives the laser light 22 that is converged at its small light receiving area so as to be able to obtain an EIT signal having large detected intensity. The oscillator of the fourth embodiment has an independent structure from that of the first to third embodiments, so that the structure of the first to third embodiment can be added to the structure of the fourth embodiment. That is, the convex lens 30b or the refractive index distribution type lens 30c may be adopted in place of the concave lens 30a described in this embodiment as the refraction unit 30 (the first refraction unit).

Fifth Embodiment

Figure 5:
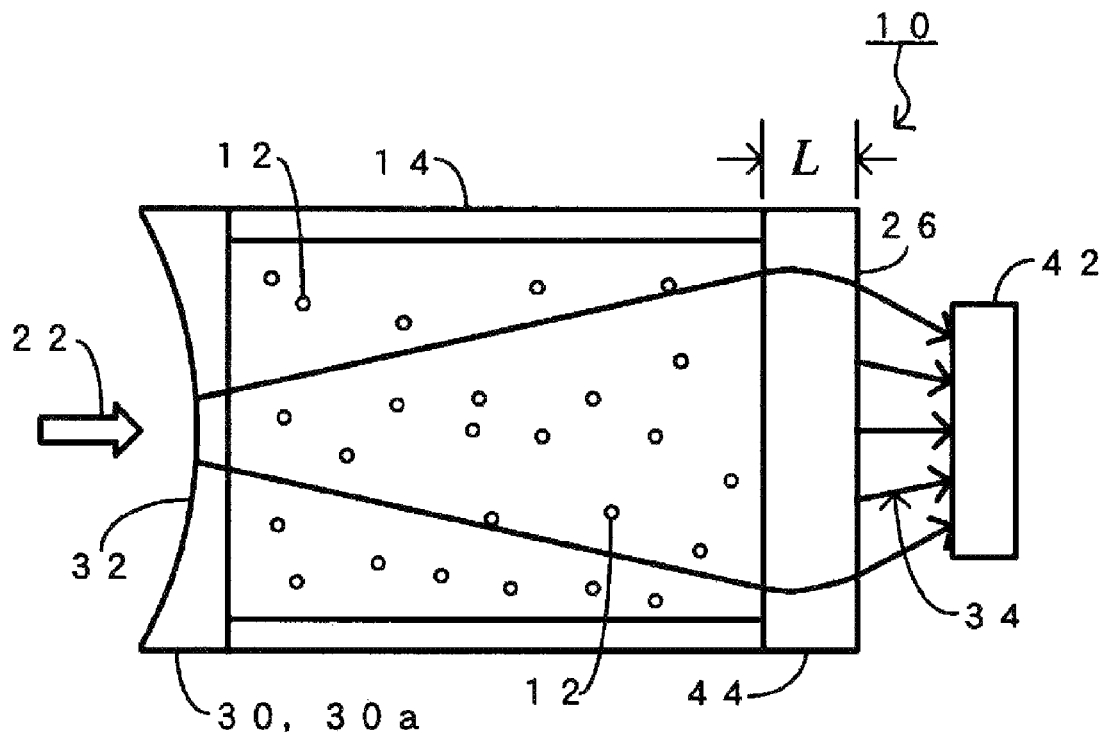
FIG. 5 is a schematic view showing an atomic oscillator of a fifth embodiment.

FIG. 5 is a schematic view showing an atomic oscillator according to a fifth embodiment. Though the essential structure of the atomic oscillator according to the fifth embodiment is similar to that of the fourth embodiment, the light emitting window 26, which is positioned to face the light detector 42, of the gas cell 14 is a refractive index distribution type lens 44 (the second refraction unit).

As described above, changing the thickness L of the refractive index distribution type lens 44 enables the change of the focal distance f. Therefore, in the fifth embodiment, the thickness L is set such that the focal distance f of the refractive index distribution type lens 44 (the second refraction unit) forming the light emitting window 26 is shorter than that of the refraction unit 30 (the first refraction unit) forming the light incident window 20 in the similar way to the fourth embodiment. Accordingly, the light flux of the laser light 22 spatially dispersed by the refraction unit 30 can be converged.

According to the fifth embodiment, the oscillator has the similar advantage to that of the fourth embodiment. Further, the gas cell 14 has the flat plate structure at its side facing the light detector 42, achieving the stuck structure between the planar optical element (not shown), which is interposed between the gas cell 14 and the light detector 42, and the light detector 42. Therefore, the oscillator with the planar optical element can be miniaturized in a similar way to the third embodiment. Further, no gap is produced between the optical elements so as to provide a dust control effect, being able to secure prolonged reliability of the device. The refraction unit 30 (the first refraction unit) can be the concave lens 30*a*, the convex lens 30*b*, or the refractive index distribution type lens 30*c* as is the case with the fourth embodiment.

In the first to third embodiments, the concave part 32, the convex part 36, and the refractive index distribution type lens 30*c* have the same size as the whole area of the light incident window 20 facing the laser light oscillating part 16. However, the concave part 32, the convex part 36, and the refractive index distribution type lens 30*c* may be formed to have a similar size to that of the cross-section area of the light flux on the optical axis of the laser light 22 because the light flux of the laser light 22 is small.

In the fourth and fifth embodiments, the focal distance of the convex lens 38 or the refractive index distribution type lens 44 that is the light emitting window 26, which faces the light detector, of the gas cell 14 may be adjusted to be similar to the focal distance of the refraction unit 30 forming the light incident window 20 so as to increase the back focus. Therefore, the gas cell 14 and the light detector 42 can be disposed at a distance, being able to suppress generation of a noise, which is caused by heat emitted from the gas cell 14, of the light detector 42. Here, in a case where the focal distance of the convex lens 38 or the refractive index distribution type lens 44 is adjusted to be same as that of the refraction unit 30, the light flux of the emitted light 34 emitted from the gas cell 14 can be parallel light.

What is claimed is:

1. An atomic oscillator that controls an oscillation frequency by using an optical absorption property derived from a quantum interference effect occurring when two kinds of resonance light are made incident as coherent light having different wavelengths from each other, comprising:
    an optical system, the optical system including:
        a gas cell sealing metal atoms in a gas state therein;
        a coherent light source for supplying the resonance light to the metal atoms being in the gas cell;
        a first refraction unit for spreading the resonance light in the gas cell; and
        a light detector for detecting light transmitted through the gas cell,
    wherein the first refraction unit seals the metal atoms in an internal space of the gas cell.

2. The atomic oscillator according to claim 1, wherein the first refraction unit is a concave lens.

3. The atomic oscillator according to claim 1, wherein the first refraction unit is a convex lens.

4. The atomic oscillator according to claim 1, wherein the first refraction unit is a refractive index distribution type lens.

5. The atomic oscillator according to claim 1, wherein a second refraction unit is formed at a side, the side facing the light detector, of the gas cell, and the second refraction unit is a convex lens.

6. The atomic oscillator according to claim 1, wherein a second refraction unit is formed at a side, the side facing the light detector, of the gas cell, and the second refraction unit is a refractive index distribution type lens.

7. The atomic oscillator according to claim 1, wherein the coherent light is laser light.

8. The atomic oscillator according to claim 1, wherein the metal atoms in a gas state are one of rubidium and cesium.

\* \* \* \* \*